United States Patent [19]
Raiff et al.

[11] 3,942,259
[45] Mar. 9, 1976

[54] APPARATUS FOR DRYING PHOTOSENSITIVE SHEETS FOR THE PRODUCTION OF PRINTING PLATES

[75] Inventors: Siegfried Raiff, Weisenheim am Berg; Werner Lenz, Ludwigshafen, both of Germany

[73] Assignee: BASF Aktiengesellschaft, Ludwigshafen (Rhine), Germany

[22] Filed: Sept. 26, 1973

[21] Appl. No.: 400,719

[52] U.S. Cl. .............................. 34/1; 34/4; 34/155; 219/388
[51] Int. Cl.² .......................................... F26B 3/34
[58] Field of Search ...... 34/1, 162, 4, 161, DIG. 10, 34/17, 18, 34, 88, 151, 155, 156; 219/388; 432/227

[56] References Cited
UNITED STATES PATENTS

| | | | |
|---|---|---|---|
| 2,355,670 | 8/1944 | Naeher | 34/4 |
| 2,355,671 | 8/1944 | Naeher et al. | 34/4 |
| 2,406,821 | 9/1946 | Fox | 34/155 |
| 2,831,267 | 4/1958 | Gardner | 34/4 |
| 2,887,942 | 5/1959 | Frantz | 34/162 |
| 3,786,575 | 1/1974 | Riblett | 34/88 |

Primary Examiner—Kenneth W. Sprague
Assistant Examiner—James C. Yeung
Attorney, Agent, or Firm—Johnston, Keil, Thompson & Shurtleff

[57] ABSTRACT

The invention relates to an apparatus for drying photosensitive sheets, which have already been exposed to light and washed out, for the production of printing plates. According to the invention, a drying chamber is combined with a post-exposure device, the drying chamber and post-exposure device preferably being separated by a partition which transmits actinic light rays. The apparatus according to the invention can be used with advantage in the production of printing plates with photosensitive layers, particularly because it can considerably shorten the times hitherto required for the production of the plates.

8 Claims, 1 Drawing Figure

U.S. Patent  March 9, 1976  3,942,259
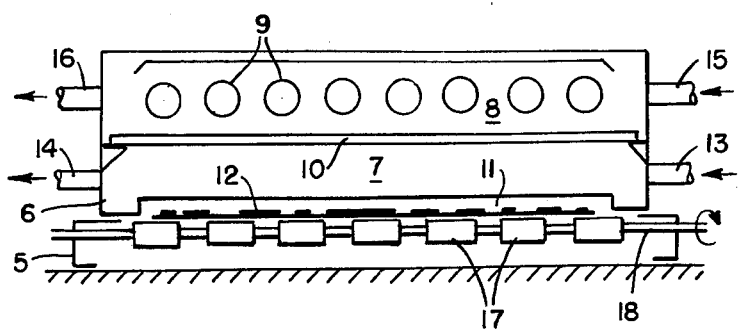

APPARATUS FOR DRYING PHOTOSENSITIVE SHEETS FOR THE PRODUCTION OF PRINTING PLATES

The present invention relates to an apparatus for drying exposed and washed out photosensitive sheets, which may be self-supporting or applied to a support, for the production of printing plates, the apparatus comprising a drying chamber in which the sheet can, in its drying position, be exposed to a drying medium.

Conventional drying apparatus of the said type consist of a drying chamber which is heated, for example, by means of a hot air blower and in which the sheet to be dried is kept in the drying position, whilst either stationary or moving, until the previously exposed and washed out photopolymer sheets or other photosensitive coatings have dried. In these conventional drying apparatus, relatively long periods are required to effect drying, after which the sheet must be hard so that it can be used for printing. However, in the production of printing plates, especially for daily papers, journals or other topical publications, drying times of the order of magnitude of a few minutes are desirable.

An object of the present invention is to complete and accelerate hardening of exposed and washed out photosensitive sheets for printing plates.

This object is achieved, according to the invention, by an apparatus for drying exposed and washed out photosensitive sheets, which are self-supporting or applied to a support, for the production of printing plates, the apparatus comprising a drying chamber in which the sheet can, in its drying position, be exposed to a drying medium, characterized in that a post-exposure device is so arranged relative to the surface of the sheet that it irradiates the surface of the sheet in the drying position of the sheet. This arrangement of the post-exposure device and drying apparatus relative to one another has the advantage that hardening of what subsequently becomes the printing plate is completed and, in addition, is accelerated by a factor of at least three, which makes the use of such printing plates particularly interesting from an economical point of view. The term "drying position of the sheet" means a position which the sheet occupies shortly before or during drying.

In an advantageous embodiment of the apparatus according to the invention, the drying chamber comprises a housing with a cavity having approximately the shape of a rectangular parallelpiped and provided with at least one inlet and outlet for the sheet to be dried, the latter being exposed to the drying medium in a flat drying position, and at least one source of actinic light preferably consisting of fluorescent tubes being located above the drying position of the sheet. The combination of drying means and post-exposure device reduces the number of handling operations as compared with conventional apparatus. Moreover, the combined device according to the invention is easy to manufacture.

In a further advantageous embodiment the drying chamber is separated from a chamber containing the actinic light sources by means of at least one partition which transmits actinic radiation, preferably a borosilicate glass partition. This makes it possible to cool the light sources, preferably the fluorescent tubes, substantially independently of the drying process without there being a substantial loss of light.

In yet another advantageous embodiment, the sheet to be dried is transported, during the drying process, past the post-exposure device through the drying chamber, by means of a conveying device. It is also possible to locate the sheet which is to be dried in a fixed drying position and to so arrange the post-exposure device and drying device that they are movable relative thereto, and in particular displaceable parallel thereto. This makes it possible to substantially automate the drying and post-exposure operations.

Details of the apparatus according to the invention are described below with reference to the embodiment shown in the drawing.

The drawing is a schematic end view of a drying apparatus according to the invention.

On frame 5 there is arranged a housing 6, whose cavity, which is approximately the shape of a rectangular parallelpiped, is divided into the drying chamber 7 and the chamber 8 containing the fluorescent tubes 9 by a sheet of glass 10. The drying chamber 7 has at least one inlet 11 for the plate 12 which is to be hardened. The fluorescent tubes 9 are thus located approximately parallel to the plate 12. However, it is also possible to arrange them differently relative to the plate provided that adequate exposure is ensured. The drying chamber 7 is equipped with inlet and outlet pieces 13 and 14, filtered hot air produced by equipment which is not shown, such as air heaters and blowers, entering through inlet piece 13. The hot air which has cooled and is subsequently reheated, and off-gases produced in particular by evaporation of the solvent used for washing the sheet, issue through outlet piece 14. It is also necessary to ensure that the solvent vapors are removed as quickly as possible from the chamber 7.

The chamber 8 possesses inlet and outlet pieces 15 and 16, for cold air to enter and leave. This air serves to cool the fluorescent tubes 9 in order to ensure a long life and optimum light yield. Cooling with extraneous air is also necessary to render the apparatus explosion-proof. The chamber 8 must furthermore be so designed, and the air supply and air withdrawal so correlated, that slight atmospheric pressure is maintained inside chamber 8, which substantially eliminates the risk of the apparatus exploding as a result of explosive gas mixtures entering the said chamber from outside, especially from the chamber 7.

The mode of operation of the apparatus will now be explained briefly. At the inlet to the apparatus, the washed out photopolymer layer of the printing plate with the relief image is still moist with solvent. The drying operation carried out in the apparatus is necessary in order to harden the layer so that a finished printing plate is ready for printing as rapidly as possible. However, the drying temperature in the drying chamber 7 is restricted to approx. 80°C to prevent the layer from being damaged due to blistering, bursting of the blisters or thermal transformation of the material, for example thermal polymerization processes. However, some parts of the washed out layer are, at this stage, not yet sufficiently photopolymerized for them to be properly hardened by the known drying operation and are thus not immediately ready for printing.

A post-exposure shortly before, or during, drying promotes hardening of all parts of the film in that it makes it possible to raise the temperature at the surface of the plate to approx. 110°C by raising the temperature of the stream of air. This combination of post-exposure and drying results in an extremely short drying time of 3 to 5 minutes per plate.

In an advantageous embodiment of the apparatus, there is provided between frame 5 a conveying device for the plate, which device consists, for example, of magnetic rollers 17 mounted on a shaft 18 being rotated in the direction of the arrow a. This magnetic-roller conveying device can only be used for plates having a ferromagnetic support. Such a device enables the plate to be automatically transported, for example, from the exposure unit to the washout device and subsequently to the drying apparatus, both batchwise and continuous operation being possible. In order to save space, the housing 6 which contains the exposure device and drying apparatus can of course also be movably arranged relative to a fixed plate 12 which is to be dried, in particular arranged to be displaceable parallel to the plate 12.

The fluorescent tubes 9 can be switched on during, or prior to, heating-up of the drying chamber 7. They may however also be switched on during the drying operation because experiments carried out under field operating conditions have shown that, for example, Nyloprint-R plates (manufactured by BASF Aktiengesellschaft, 6700 Ludwigshafen, Germany) require a post-exposure time of only about 30 seconds.

We claim:

1. An apparatus for drying and curing a polymerizable layer in the production of a photopolymer printing plate which has been exposed through an image-bearing transparency to a source of actinic radiation in order to cure the exposed portions of the layer and which further has been washed by a solvent in order to remove the non-exposed, uncured portions of the layer, said apparatus comprising:
    a housing;
    a first chamber within said housing;
    an actinic light source positioned within said first chamber;
    a second chamber within said housing and adjacent to said first chamber, said second chamber being separated from said first chamber by a member transparent to actinic radiation;
    a means for supporting the polymerizable layer within said second chamber in a manner so that said actinic light source exposes said layer a second time while in said second chamber in order to cure the uncured, non-washed portions thereof;
    inlet and outlet means within said second chamber for conveying a drying medium through second chamber and over the surface of said layer, said drying medium producing after said second actinic light exposure a temperature at the surface of said layer substantially higher than the temperature at which the layer would be thermally damaged if it had not been exposed to said actinic light source the second time.

2. A method for drying and curing a polymerizable layer in the production of a photopolymer printing plate which has been exposed through an image-bearing transparency to a source of actinic radiation in order to cure the exposed portions of the layer aand which further has been washed by a solvent in order to remove the non-exposed, uncured portions of the layer, said method comprising:
    exposing said layer a second time to actinic radiation without the use of an image-bearing transparency, thereby curing the uncured, non-washed portions of the layer;
    drying the layer after said second exposure by removing the solvent from the layer at a temperature at the surface of the layer substantially higher than that temperature at which the layer would be thermally damaged if it had not been exposed to said actinic radiation a second time.

3. Apparatus for drying and hardening photosensitive sheets for use in preparing printing plates which comprises in combination:
    a housing;
    a first chamber within said housing;
    means for supporting washed out photosensitive sheets within said chamber;
    inlet and outlet means associated with said chamber for conveying drying medium through said first chamber and over said sheets;
    a second chamber within said housing and adjacent to said first chamber, said second chamber being separated from said first chamber by a transparent member;
    an actinic light source positioned within said second chamber for supplying actinic light to said first chamber through said transparent member; and,
    inlet and outlet means within said second chamber for conveying cooling fluid over said light source.

4. An apparatus as claimed in claim 3 which includes means for transporting said sheet past the source of actinic light during the drying process.

5. An apparatus as claimed in claim 3, wherein the source(s) of actinic light consist of a plurality of fluorescent tubes.

6. An apparatus as claimed in claim 3, wherein the partition(s) which transmit actinic radiation are made of borosilicate glass.

7. An apparatus as claimed in claim 3, wherein the sheet to be dried is held in a fixed drying position and the drying chamber and source of actinic light are movable relative thereto.

8. An apparatus as claimed in claim 7, wherein the drying chamber and source of actinic light are displaceable parallel to the sheet.

* * * * *

UNITED STATES PATENT AND TRADEMARK OFFICE
CERTIFICATE OF CORRECTION

PATENT NO. : 3,942,259
DATED : March 9, 1976
INVENTOR(S) : Siegfried Raiff et al It is certified that error appears in the above-identified patent and that said Letters Patent are hereby corrected as shown below:

In the Heading, insert -- [30] Foreign Application Priority Data   October 2, 1972   Germany   P 22 48 300.7 --

In Column 4, Line 5, delete "aand" and substitute --and--

*Signed and Sealed this*

Twenty-eighth *Day of* September 1976

[SEAL]

Attest:

RUTH C. MASON
*Attesting Officer*

C. MARSHALL DANN
*Commissioner of Patents and Trademarks*